United States Patent [19]

Bourdelaise et al.

[11] Patent Number: 5,298,686
[45] Date of Patent: Mar. 29, 1994

[54] SYSTEM AND METHOD FOR IMPLEMENTING WIRING CHANGES IN A SOLDERLESS PRINTED WIRING BOARD MODULE

[75] Inventors: Robert A. Bourdelaise, Crofton; David B. Harris, Columbia; David R. King, Woodlawn, all of Md.; Guy N. Hurst, West Carrollton, Ohio

[73] Assignee: Westinghouse Electric Corp., Pittsburgh, Pa.

[21] Appl. No.: 601,558

[22] Filed: Oct. 23, 1990

[51] Int. Cl.⁵ .............................. H05K 1/00
[52] U.S. Cl. .......................... 174/254; 174/260; 174/262; 361/785
[58] Field of Search ............. 174/254, 260, 261, 262, 174/263, 264; 361/403, 410, 413, 414; 439/66

[56] References Cited
U.S. PATENT DOCUMENTS

| | | |
|---|---|---|
| 3,780,352 | 12/1973 | Redwanz . |
| 4,251,852 | 2/1981 | Ecker et al. . |
| 4,358,785 | 11/1982 | Takigami et al. . |
| 4,642,889 | 2/1987 | Grabbe ................ 361/403 X |
| 4,647,959 | 3/1987 | Smith . |
| 4,658,332 | 4/1987 | Baker et al. .......... 361/403 X |
| 4,860,088 | 8/1989 | Smith et al. . |
| 4,933,808 | 6/1990 | Horton et al. . |
| 5,007,841 | 4/1991 | Smolley ................ 439/66 |
| 5,046,953 | 9/1991 | Shreeve et al. ........ 439/66 |

Primary Examiner—Leo P. Picard
Assistant Examiner—Cheryl R. Figlin
Attorney, Agent, or Firm—D. Schron

[57] ABSTRACT

Both a system and method is provided for implementing a wiring change with respect to an electrical component detachably connected to a solderless PWB module. The system comprises at least one unused via on the PWB, an insulator used for electrically disconnecting a selected contact pad of the component from a contact pad disposed on the PWB, and a metallic strip mounted on a substrate for electrically connecting the selected component contact pad to the unused via. In one embodiment of the system, the substrate used to support the conductive strip is the compliant, insulative sheet material used in the interface that normally interconnects the pads of the electrical component with the pads of the PWB module. Alternatively, a separate "smart" layer formed from a thin insulative sheet material may be used to support the conductive strip. The "smart" layer has an array of conductive regions disposed through its thickness which maintains the contact between the pads of the PWB and the pads of the electrical component. However, when a change is desired, these conductive areas may be abraded off, and a copper strip connector may be provided on the surface of the "smart" layer between the disconnected component contact pad and an unused via by conventional photo-resist techniques.

35 Claims, 7 Drawing Sheets

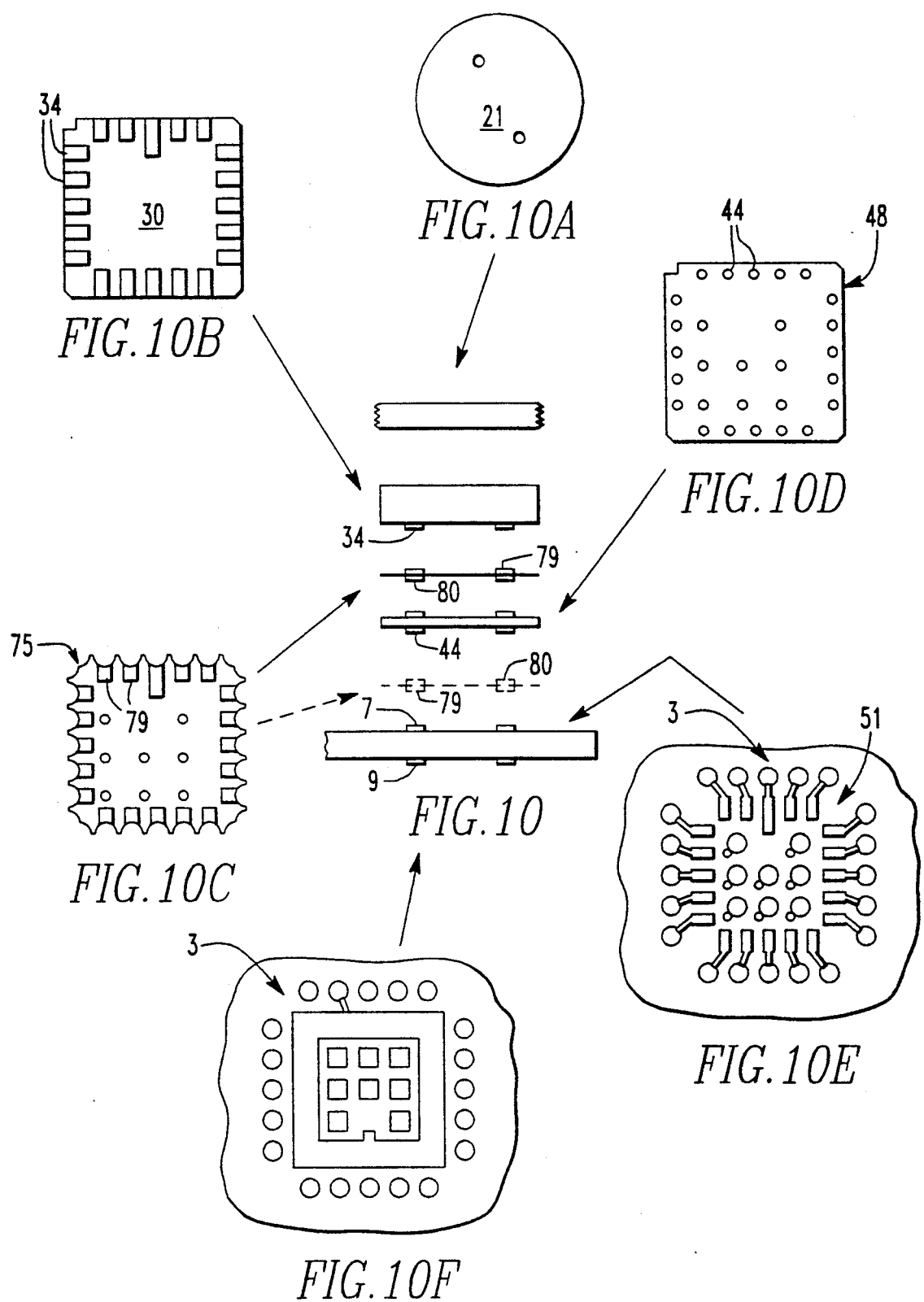

SYSTEM AND METHOD FOR IMPLEMENTING WIRING CHANGES IN A SOLDERLESS PRINTED WIRING BOARD MODULE

BACKGROUND OF THE INVENTION

This invention generally relates to solderless printed wiring board modules, and is specifically concerned with a system and method for implementing a wiring change with respect to any electrical component detachably connected to a PWB.

Solderless printed wiring board modules are known in the prior art. Such modules comprise a printed wiring board (PWB) having one or more arrays of contact pads (known as "footprints" in the art), a heat-conductive guide plate assembly having a plurality of apertures that are registrable with the pattern of contact pad arrays on the PWB, each aperture being matable with an electronic component, and an interface formed from a piece of compliant, insulative sheet material that is receivable within one of the apertures of the guide plate. The interface includes a plurality of resilient electrical connectors (called "button connectors" in the art) that are registrable with the contact pads of the PWB When the interface is dropped into one of the apertures of the guide plate. Each of these button connectors is formed from a small, springy cylinder of randomly compressed, thin gauge copper-beryllium wire that has been gold plated. Each of these connectors is frictionally received within a through-hole present in the interface.

In operation, the interface is first dropped into one of the apertures of the guide plate assembly. The shape of the outer edge of the compliant sheet material forming the interface is matable within the aperture in the guide plate, and the button connectors are registrable with the contact pads of the PWB such that the lower end of each of the connectors engages one of the pads in ,the PWB. An electrical component is next dropped into the aperture of the guide plate. The shape of the outer edge of the electrical component is likewise matable with the aperture in the guide plate assembly such that its contact pads become aligned with the upper ends of the button connectors held by the interface. When the electrical component is compressed downwardly toward the PWB, each of the resilient button connectors provides a positive, spring contact between the pads of the PWB, and the corresponding pads of the electrical component. Such a PWB module is disclosed and claimed in U.S. Pat. No. 4,933,808, invented by Messrs. Robert Bourdelaise, David Harris and Roald Horton, and assigned to the Westinghouse Electric Corporation.

Such solderless PWB modules provide a great many advantages over conventional, soldered printed wiring board modules. The elimination of the soldering operation between the pads of the electrical components and the printed wiring board eliminates up to 67 percent of the required assembly time, and further greatly reduces the possibility of component damage due to overheating. Such solderless PWB modules may provide a higher degree of reliable interconnection between the electric-al components and the printed wiring boards, as there is no possibility of defective connections occurring as a result of solder splattering or defective solder joints. Because of the need for inspecting finished solder joints, soldering encouraged perimeter-type connections to be made between the electrical component and the printed wiring board, where the finished connections could be seen. In instances where the electrical component had a large density of leads projecting out around its perimeter, the margin for error became very small for the proper soldering of each of these leads to its respective contact pad on the PWB as the distance between the leads became small. By contrast, the advent of solderless PWB modules which utilizes a sheet-like interface that holds an array of small, springy button connectors to create electrical contact between the pads of the component and the PWB made it much more practical to spread these connections out in an area array pattern, where the connections are uniformly spaced apart from one another throughout the entire area under the component, as opposed to locating these connections to only around the perimeter, thereby reducing the probability of an assembly error. The elimination of soldering in solderless PWB modules also advantageously obviates the need to use fluorocarbon solvents which contribute to the degradation of the ionosphere. Finally, such solderless PWB modules have much more effective heat sink properties than their prior art counterparts, and are far easier to test, repair and replace components on.

Unfortunately, until the advent of the present invention, there was no known way to implement wiring changes in such solderless PWB modules. This is a significant limitation, as it adversely effects the high degree of versatility and flexibility enjoyed with such modules.

It is therefore an object of the present invention to provide both a system and a method for implementing a wiring change with respect to an electrical component detachably connected to a solderless PWB modules that is both fast, efficient and easy.

It is a further object of the invention to provide such a system and technique that obviates or at least minimizes the need for any soldered connections within the PWB module, in order that the advantages associated with the elimination of soldering might be substantially preserved.

Still another object of the invention is to provide a system and method for making wiring changes in PWB modules that utilizes inexpensive components and techniques.

Finally, it is an object of the invention to provide a system and method in which more than one wiring change may be made on more than one occasion in a fast, simple and economical manner both between electrical components such as surface mounted components and PWBs as well as between two or more PWBs of different modules.

As used herein, the term "electrical component" includes not only surface mounted components (SMCs) such as packaged integrated circuits, and individual components such as capacitors, transistors, diodes or the like, but also the PWBs of other modules.

SUMMARY OF THE INVENTION

Generally speaking, the invention is both a system and a method for implementing a wiring change with respect to an electrical component that is detachably connected within a solderless PWB module. The system generally comprises at least one "forbidden" or unused via in the PWB, means for electrically disconnecting a selected contact pad of the electrical component from a contact pad disposed in the PWB, and means for electrically connecting the selected electrical component contact pad to the unused via.

The means for electrically connecting the selected electrical component contact pad to the unused via may be a strip of conductive material mounted on a substrate formed from an insulative sheet material. In one embodiment of the invention, this substrate is the same section of compliant, insulative sheet material that forms the connecting interface in the PWB module. In this embodiment, the means for electrically disconnecting the selected electrical component contact pad from a contact pad on the PWB is preferably a hardenable, insulative material such as an ultraviolet-curable epoxy material. The strip of conductive material may be formed either by the application of a conductive, hardenable material between a selected group of lands on the interface to form a conductive "bridge" between the unused via and the electrically disconnected electrical component contact pad. In the alternative, this strip of conductive material may be formed from a thin strip of conductive metal by conventional photo-resist techniques where the entire upper surface of the interface is initially clad in copper, nickel and gold and the desired metal strip is formed by applying a pattern of photo-resist over the desired strip of metal and then etching away the unwanted metal.

In a further alternative embodiment of the invention, the substrate that supports the strip of conductive material that connects the selected pad of the electrical component to the unused via may be a "smart" layer formed from a thin layer of compliant, insulative material that is separate from the compliant sheet material used to form the interface. In this embodiment, the thin layer may be formed from a material such as Kapton ® that is only about 0.005 inches thick. This Kapton ® sheet includes an array of conductive areas which extend completely through its thickness for interconnecting the array of electrical component contact pads with the PWB contact pads which register with them. When the system operations desires to make a wiring change, any of the contact pads of the electrical component may be disconnected from its corresponding pad on the PWB by abrading away the corresponding conductive area on the thin layer. This disconnected electrical component contact pad may then be connected to a forbidden via by providing a conductive strip between the disconnected pad and the forbidden via over the surface of the thin layer. The conductive strip is preferably a thin strip of copper formed by the aforementioned photo-resist technique.

Once the disconnected electrical component pad has been reconnected to a "forbidden" or unused via, a jumper wire can in turn be connected to the via at the back of the PWB to complete the desired wiring change. The system and method of the invention facilitates fast changes in the wiring of PWB modules while substantially preserving all of the advantages associated with these modules.

BRIEF DESCRIPTION OF THE SEVERAL FIGURES

FIG. 10 is a conceptual drawing that illustrates where the "smart" layer associated with the second embodiment of the system may be located to effect a wiring change in a PWB module;

FIG. 10A is a plan view of a slug retainer;
FIG. 10B is a plan view of an electrical component;
FIG. 10C is a plan view of a "smart" layer;
FIG. 10D is a plan view of a modified connecting interface;
FIG. 10E is a top plan view of footprints on a printed wiring board, and
FIG. 10F is a bottom plan view of the printed wiring board of FIG. 10E.

DETAILED DESCRIPTION OF THE PREFERRED EMBODIMENT

Figure 1A:
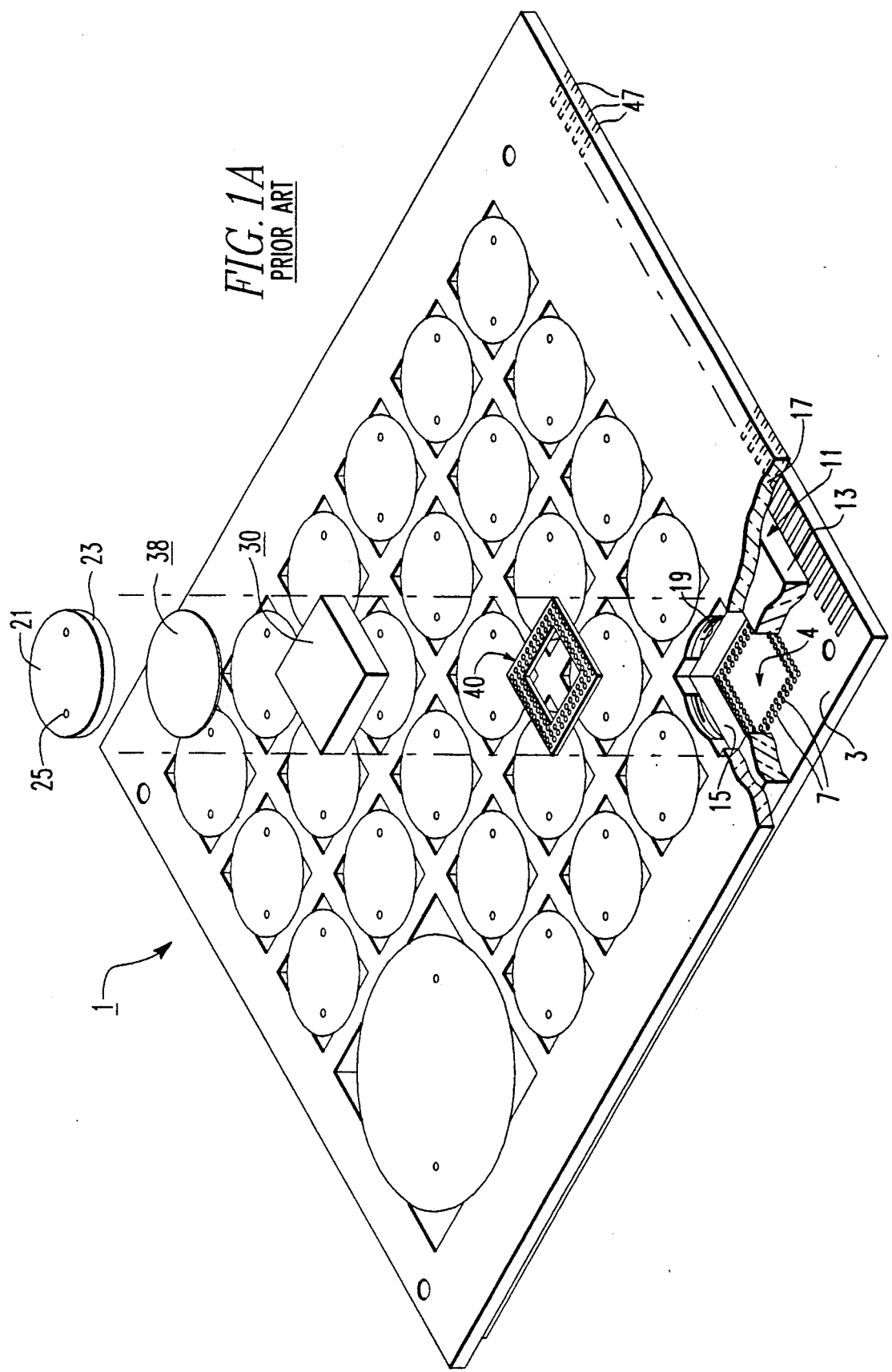
FIG. 1A is a perspective view of the type of PWB module that the system and method of the invention may be used to implement a wiring change within, illustrating in exploded form how the various components of this module are assembled.
Figure 1B:
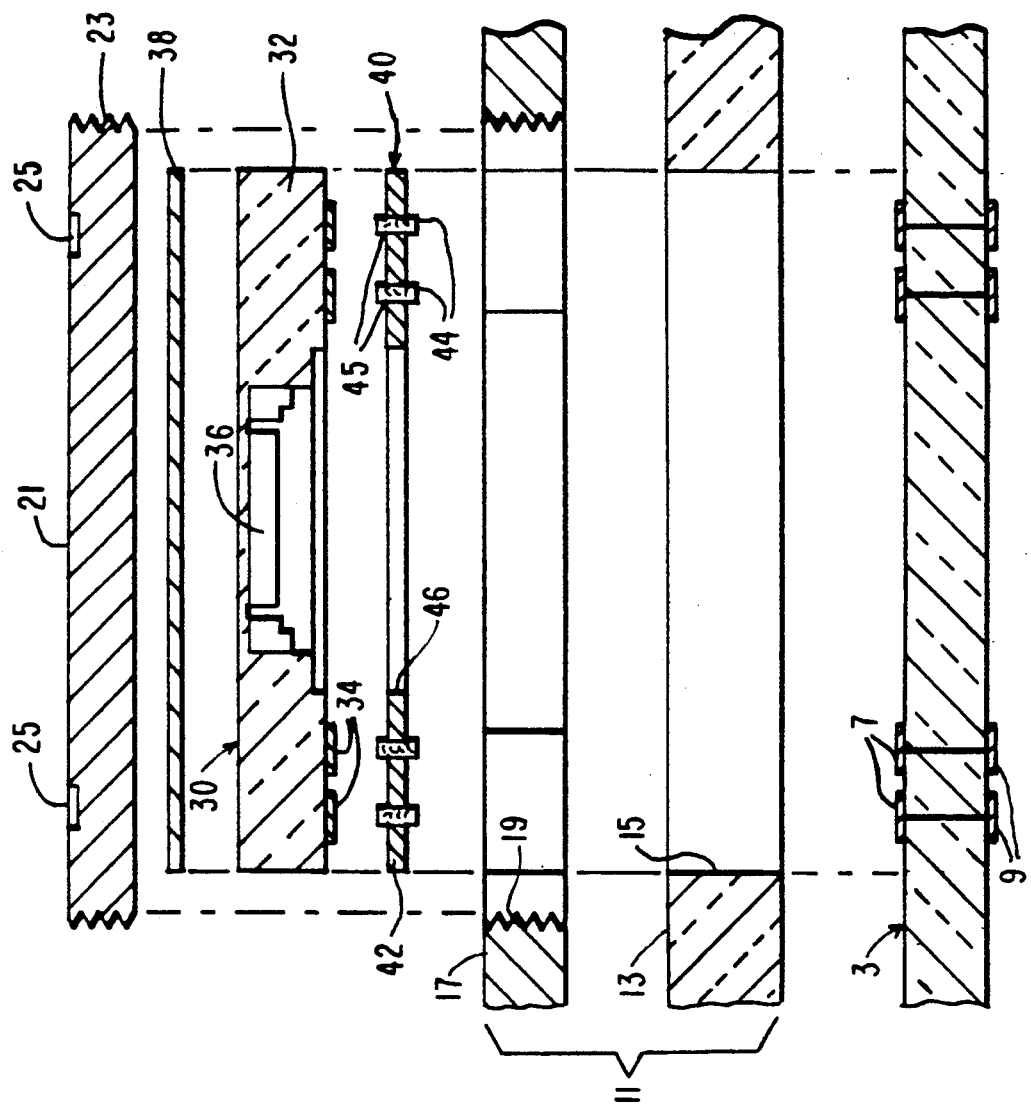
FIG. 1B is a side, cross-sectional view of the components of the PWB module illustrated in exploded form in FIG. 1A.

With reference now to FIGS. 1A and 1B, the purpose of the system and method of the invention is to implement a wiring change with respect to one or more of the electrical components detachably connected to a solderless PWB module 1. Such modules generally comprise a flat PWB board 3 having a plurality of arrays 4 of connector pads 7 on its upper surface for electrically engaging a corresponding array of pads on an electrical component. Such boards 3 further include a plurality of arrays of component test pads 9 on their lower surfaces with are connected to the pads 7 on their upper surfaces. The purpose of the test pads 9 is to allow a technician to easily test the operability of an electrical component mounted within the module 1 without the need for disassembling the module 1 and removing the component to be tested. While not specifically illustrated in any of the drawings, it should be noted that the PWB board 3 may and often does include a three dimensional arrangement of conductive elements that are encased in the matrix of insulative material that forms the board 3. These unshown connector components interconnect the various electrical components mounted on the board 3 in accordance with a desired circuit scheme.

A guide plate assembly 11 is mounted over the upper surface of the PWB board 3 for both aligning and securing electrical components over the various arrays 4 of PWB connector pads 7. The guide plate assembly 11 is provided with an alignment plate 13 that directly engages the upper face of the PWB board 3 and which includes a plurality of apertures 15 which are matable with the electrical components to be connected to the board 3. The alignment plate 13 is preferably formed from an insulative, heat-resistant plastic material. The guide plate assembly 11 further includes a heat dissipation plate 17 that is mounted over the upper surface of the alignment plate 13 as shown. The heat dissipation plate 17 includes openings 19 which are threaded around their inner peripheries and that are registrable with the apertures 15 of the plate 13 and capable of matably receiving an electrical component. To mount an electrical component over an array 4 of connector pad 7, the PWB module is further provided with a slug retainer 21 having a threaded edge which screws into the threaded openings 19 of the heat dissipating plate 17. The upper surface of the slug retainer 21 has a pair of wrench receiving bores 25 that receive the prongs of a spanner wrench so that the slug 21 may be screwed into snug engagement against a ledge 27 (see FIG. 2A) formed from the upper edge of the aperture 15 in the alignment plate 13. In an assembled PWB module 1, an electrical component 30 is captured between the inner surface of the slug retainer 21, and the upper surface of the PWB board 3. Such electrical components typically (but not always) include a carrier housing 32 formed from an insulative material having a plurality of contact pads 34 on one of its sides which are registrable with the contact pads 7 of the PWB board 3. In this particular example of a PWB module 1, the electrical component 30 includes an integrated circuit 36 whose output leads are each connected to one of the contact pads 34 by means of wires (not shown) embedded in the matrix of insulative, heat-resistive material forming the carrier housing 32. A thermally conductive spacer 38 is typically disposed between the upper surface of the electrical component 30, and the lower surface of the slug retainer 21. The provision of such a spacer 38 (which is preferably formed from a repairable, heat-conductive adhesive)insures good thermal contact between the electrical component 30, and the slug retainer 21, which in turn effectively dissipates the heat through the previously described plate 17.

Figure 2A:
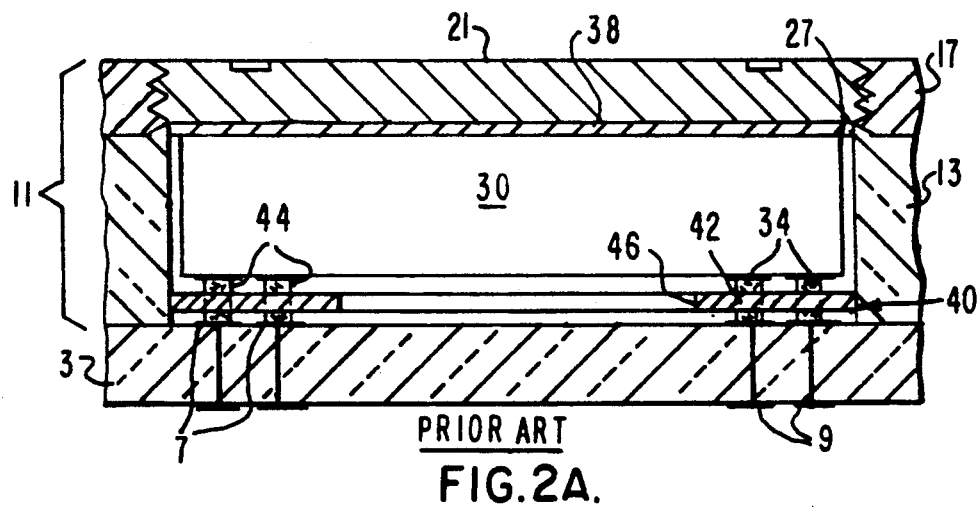
FIG. 2A is a cross-sectional side view of the components illustrated in FIG. 1B as they would appear in assembled form.
Figure 2B:
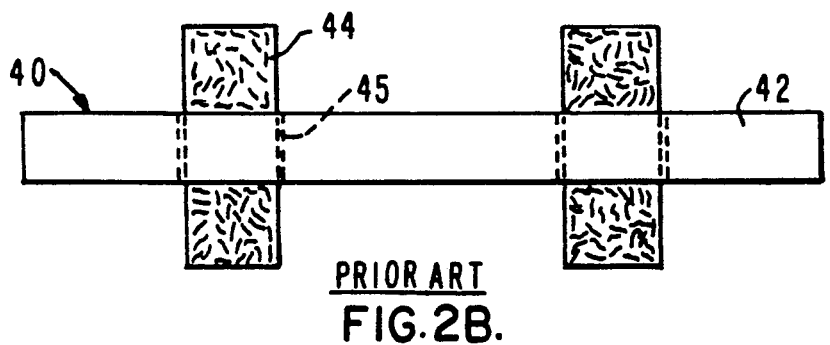
FIG. 2B is an enlarged side view of the interface used to interconnect the connector pads of the PWB board of the module to the connector pads of an electrical component.

With reference now to FIGS. 1B, 2A, and 2B, a connecting interface 40 is provided in the PWB modules 1 of prior art for effecting a positive, spring-loaded contact between the pads 7 of the PWB board 3 and the pads 34 of the electrical component 30. To this end, the connecting interface 40 includes a sheet member 42 formed from a section of compliant, insulative sheet material that is matable within the aperture 15 of the alignment plate 13. The compliant nature of the sheet member 42 helps the connecting interface 40 to accommodate small non-planarities which may exist between the contact pads 7 on the PWB board 3, and the contact pads 34 of the electrical component 30. To electrically connect these pads 7,34, the sheet member 42 is provided with an array of resilient electrical connectors known as "button" connectors 44 which are frictionally held within bores 45 that extend through the thickness of the sheet member 42. The bores 45 which receivably secure the button connectors 42 are, of course, arranged in the same pattern as the pads 7,34 on the PWB board 3 and electrical component 30. The button connectors 44 themselves are formed from a cylinder of very fine, gold plated copper-beryllium wire that has been "wadded up" to create a cylindrical structure formed from "kinked" wire having some amount of air space between the kinks. The air spaces between the cylindrical structure forming the connector buttons 44 allow for further compression of these structures, and the resilient nature of the kinks of copper-beryllium wire affords resiliency to the cylindrical structure that forms each of the button connectors 44.

In operation, the connecting interface 40 is dropped through the aperture 15 and the alignment plate 13, and an electrical component 30 is dropped in place over the interface 40 in the position illustrated in FIG. 2A. The thermally conductive spacer 38 is placed over the upper surface of the electrical component 30, and a technician screws the slug retainer 21 into the threaded opening 19 of the heat dissipation plate 17 until the bottom, outer edge of the slug 21 comes into snug engagement against the ledge 27 defined by the upper edge of the alignment plate 13 that surrounds the aperture 15. The screwing down of the slug retainer 21 compresses the springy button connectors 44 held by the sheet member 42 of the connecting interface 40 to create the desired, spring loaded electrical contacts between the pads 7 of the PWB 3 and the pads 34 of the electrical component 30, the amount of compression being controlled by the vertical position of the ledge 27.

Figure 3A:
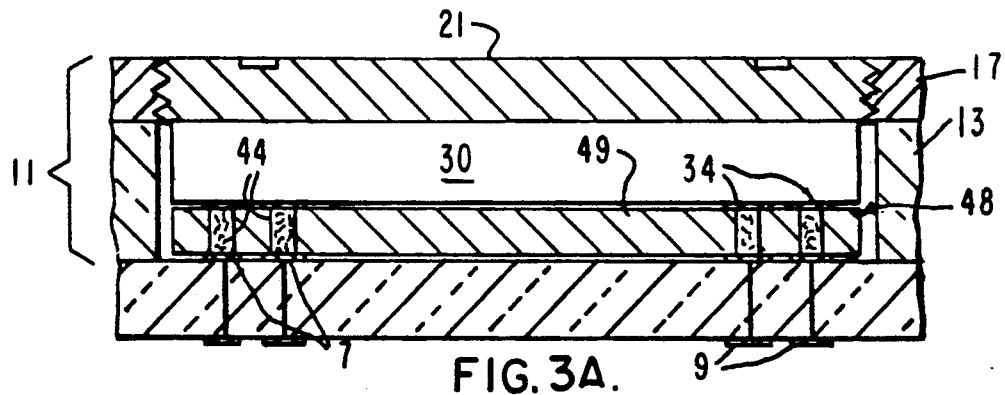
FIG. 3A is a cross-sectional side view of a modified arrangement of the components of the PWB module illustrated in FIG. 2A.
Figure 3B:
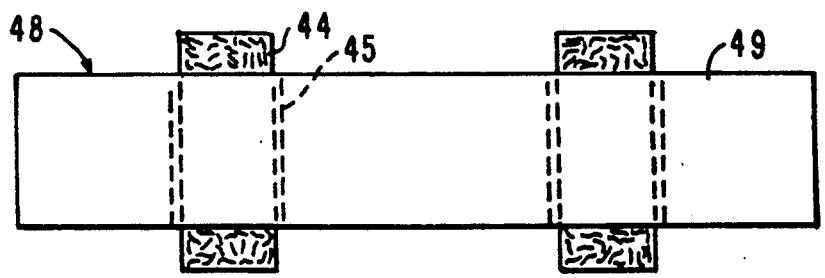
FIG. 3B is an enlarged, partial side view of the interface used in the modified version of the module illustrated in FIG. 3A.
Figure 4:
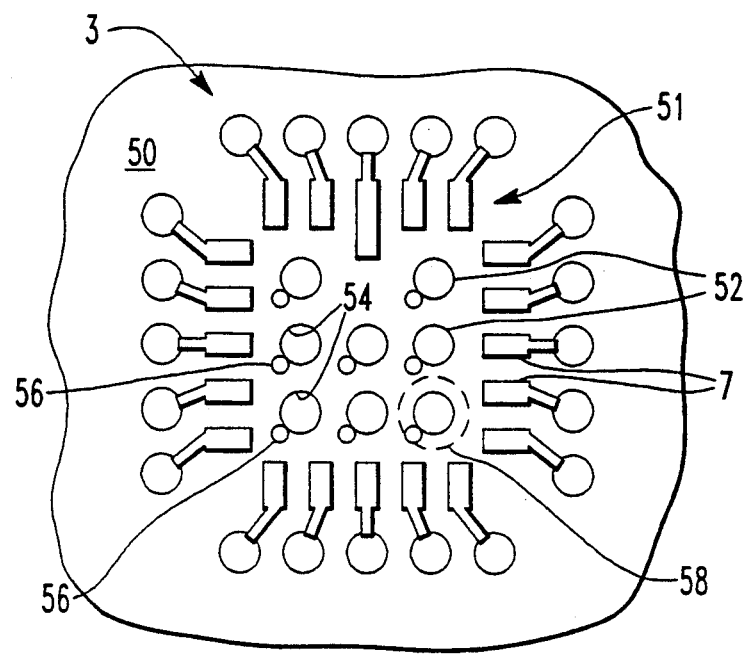
FIG. 4 is a plan view of the modified array of connector pads or "footprint" used on the PWB in the system of the invention.

FIGS. 3A and 3B illustrate a novel modification of the type of PWB module 1 that the system and method of the invention are applicable to. In this modification, both the thermally conductive spacer 38 and the ledge 27 are both eliminated, as proper spacing with respect to the pads 34 of the electrical component 30 and the pads 7 of the PWB 3 is achieved entirely through a modified connecting interface 48. In this interface 48, the compliant sheet member 49 is made considerably thicker than the sheet member 42 used in the prior art interface 40. The thickness of this sheet member 49 is chosen to comply with the length of the resilient button connectors 44 after they have been compressed to an extent which insures a good, spring loaded engagement between the pads 7,34 of the PWB board 3 and the electrical component 30, but which is not so great as to inelastically deform them. In contrast to the prior art PWB module, the amount of compression of the button connectors 44 is determined by the thickness of the compliant sheet member 49. As the modified form of the module 1 shown in FIGS. 3A and 3B is generally easier to manufacture than the prior art PWB module 1 shown in FIGS. 1A through 2B, it is significant that both the system and the method of the invention are applicable to both forms of solderless PWB modules.

Turning now to FIGS. 4, 5, 6 and 7, and a description of a first embodiment of the system of the invention that is applicable to the prior art PWB module 1 illustrated in FIGS. 1A through 2B, the system 1 includes a plurality of modified arrays or "footprints" 51 on the PWB board 3 which includes a plurality of "forbidden" or unused vias 52 disposed between the usual array of contact pads 7. Each of these unused vias 52 is formed from a bore 54 that extends completely through the PWB board 3 and which is plated with a thin coating of a conductive metal, such as copper over which a thin plating of nickel and then gold has been applied. Each of these unused vias 52 further includes, on the upper surface of the PWB board 3, an offset connector pad 56 which is registrable with a button connector 44 held within a connecting interface 40. On the lower side of the PWB board 3, each of the vias is circumscribed by a small, flat ring of conductive metal, which again is preferably copper overplated with nickel and gold. As will be described in more detail hereinafter, any one of the unused vias 52 may be used to redirect the electrical connection between the pad 34 of the electrical component 30 from the adjacent pad 7 on the PWB board 3 to a jumper wire (not shown) soldered to the connector ring 58 of one of the vias 52.

The system of the invention further includes a means for disconnecting a selected one of the pads 34 of the electrical component 30 from the adjacent pad 7 on the PWB board 3. In the embodiment of the system illustrated in FIG. 5, such disconnection means may take the form of an insulative layer 60 deposited over the pad 7 of the PWB board 3 desired to be disconnected from the corresponding pad 34 on the electrical component 30. Alternatively, the button connector 44 may be withdrawn from the bore 45 which receives it in the connecting interface. However, the removal of such a button connector 44 would only be a preferred mode of carrying out the invention in the case where the sole purpose of the wiring change was merely the disconnection of one of the pads 34 of the component 30, and not the re-routing of a circuit through the disconnected component pad 34.

Figure 5:
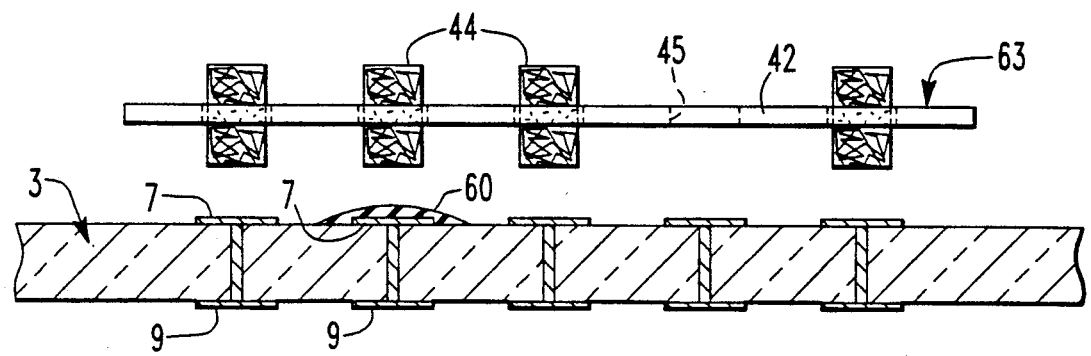
FIG. 5 is an enlarged, exploded cross-sectional side view of a modified interface which may be used in a first embodiment of the system of the invention, and how one or more of the resilient electrical connectors of this interface may be disconnected from connector pads on the PWB.
Figure 6:
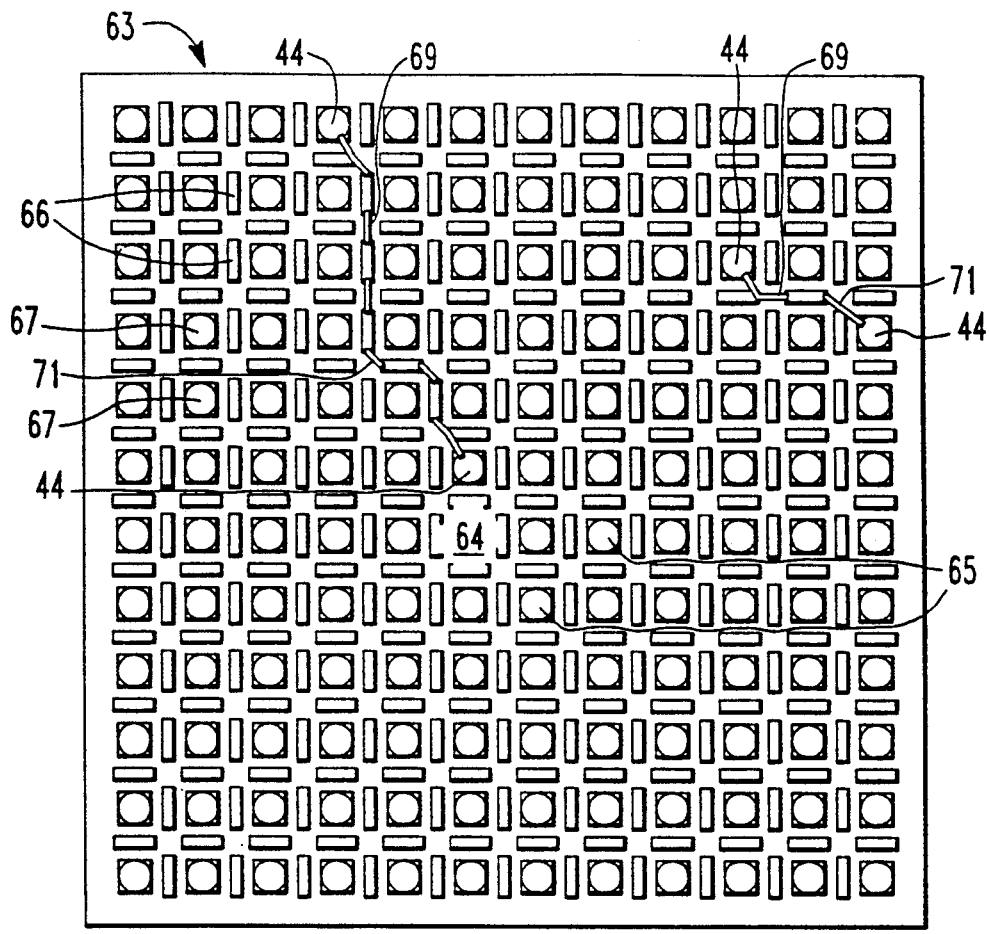
FIG. 6 is a plan view of one form of interface used in a first embodiment of the system of the invention.

With reference now to FIGS. 5 and 6, the first preferred embodiment of the system of the invention further includes a modified connecting interface 63. This interface 63 is similar in its operational aspects to the previously described interface 40 used in the prior art PWB module illustrated in FIGS. 1A through 2B. However, despite the similarities in operation three important structural differences exist between these two components. First, as is best seen with respect to FIG. 6, the modified connecting interface 63 includes a continuous central region 64 that includes a plurality of bores 65 for holding one or more button connectors 44 in registration with the offset connector pads 56 of the unused vias 52. Secondly, the modified connecting interface 63 includes a plurality of conductive lands 66 uniformly spaced around each of the button connector-receiving bores 65. Thirdly, each of the bores 65 is circumscribed by a square connector pad 67. The provision of the conductive lands 66, and the square connector pads 67 facilitate the fabrication of a conductive strip 69 which electrically re-routes a selected pad 34 of the electrical component 30 from the adjacent pad 7 in the PWB 3 to a button connector 44 which engages with one of the forbidden vias 52 when the modified connecting interface 63 is assembled within the module 1 in the configuration illustrated in FIG. 2A. In this embodiment of the system, the conductive strip 69 is formed by applying bridges of a UV curable conductive epoxy 71 between adjacent lands 66. Two engineering changes utilizing such conductive strips 69 are shown in FIG. 6. The use of a UV curable conductive epoxy greatly facilitates the fabrication of the conductive strip 69 by obviating the need for the application of photosensitive chemicals and oven baking.

Figure 7:
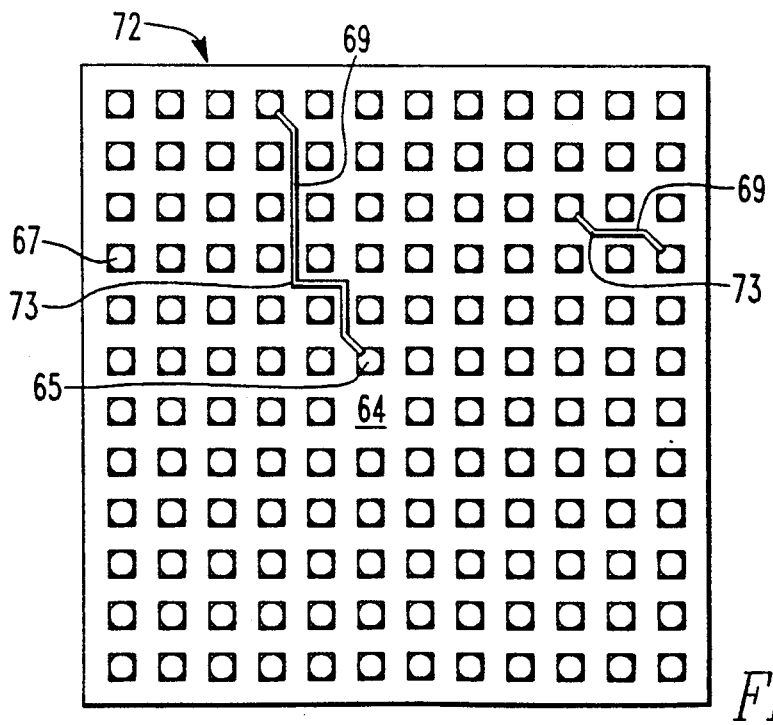
FIG. 7 is a plan view of a second form of the interface that may be used within a first embodiment of the system.

However, in instances where the same engineering change was desired for a large number of electrical components 30 in a large number of PWB modules 1, the use of the different modified connecting interface 72 illustrated in FIG. 7 would be preferred. This modified interface 72 includes all of the structural features described with respect to the modified interface 63 illustrated in FIG. 6, with the exception that the modified interface 72 has no conductive lands 66. Such lands 66 are not necessary in the modified interface 72, as the conductive strip 69 is formed from known, photo-resist techniques. Specifically, in this technique, the planar face of the modified interface 72 illustrated in FIG. 7 is initially completely clad with a thin coating of conductive copper. Both the square connector pads 67 and the conductive strip 69 are formed by applying a layer of nickel overplated with gold over the bottomlayer of copper, and then applying a pattern of photo-resist that defines the pads 67 and conductive strip 69. The balance of the unwanted gold, nickel and copper plating is then etched away, and the photo-resist chemical is then removed with a solvent. As was the case with FIG. 6, FIG. 7 illustrates two such strips 73 of conductive metal which would implement two wiring changes with respect to a particular electrical component 30.

In the method of carrying out the first embodiment of the system of the invention, the slug retainer 21 is unscrewed out of its threaded opening 19 in the heat dissipation plate 17, and the slug 21, spacer 38, component 30, and connecting interface 40 are all removed. In the next step of the method, an insulative material 60 in form of a drop of non-conductive, UV curable epoxy is placed over the PWB pad 7 desired to be disconnected from one of the pads 34 of the electrical component 20. A conductive strip 69 is next fabricated between the button connector 44 associated with the disconnected component pad 34 and another button connector 44 that will engage one of the unused vias 52. A jumper wire (not shown) is then soldered to the connector ring 58 associated with the via 52 that will be employed when the module 1 is reassembled. The module 1 is then reassembled back into its original order.

Figure 8A:
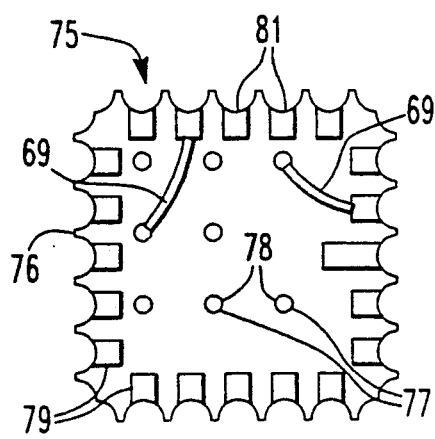
FIG. 8A is a plan view of a "smart" layer that may be used in a second embodiment of the system of the invention.

In the alternate system of the invention, the conductive strip 69 is not fabricated over the sheet material forming the interface of the PWB module. Instead, such strips 69 are fabricated over a separate, very thin, compliant layer of insulative material referred to as a "smart" layer 75 and illustrated in FIGS. 8A and 8B. This alternate embodiment of the system is particularly applicable to the modified form of the PWB module illustrated in FIGS. 3A and 3B, where the compression of the button connectors 44 is controlled solely by the thickness of the compliant section of sheet material 49. Because there is essentially no excess space left between the upper and lower surfaces of the section 49 of compliant sheet material when the module 1 is assembled into the configuration illustrated in FIG. 3A, the depositing of a drop insulating epoxy material over one of the pads 7, or the depositing of a conductive epoxy material over the upper surface of the sheet member 49 could introduce warpage in the interface of the module 1 that could be detrimental to safe and secure interconnections between the board pads 7 and the component pads 34. However, the "smart" layer 75 solves this potential problem by providing the necessary re-routing by means of a very thin layer of material of uniform thickness which can be "sandwiched" on either side of a modified interface 48 without inducing any unwanted warpage and consequent connection-breaking.

With reference again to FIGS. 8A and 8B, the smart layer 75 includes a very thin layer 76 of a non-conductive plastic material, such as Mylar ® or Kapton ®. Circular connector pads 77 are provided at either ends of through bores 78 that extend through the thickness of the thin layer 76. These circular connector pads 77 are registrable with the previously described offset pads 56 of the array of unused vias 52 present within the modified footprint 51 on the PWB board 3. The thin layer 76 further includes peripheral pairs of upper and lower contact pads 79,80 which are mutually registrable with the component pads 34 and board pads 7 and which normally serve to interconnect these pads through the button connectors 44 held in a modified interface 48. The upper and lower contact pads 79,80 are normally interconnected by semi-cylindrical bores 81 (best seen in FIG. 8B) which are coated with a removable plating 83 of gold or some other conductive metal. This plating 83 may be readily removed by abrasion.

Figure 9:
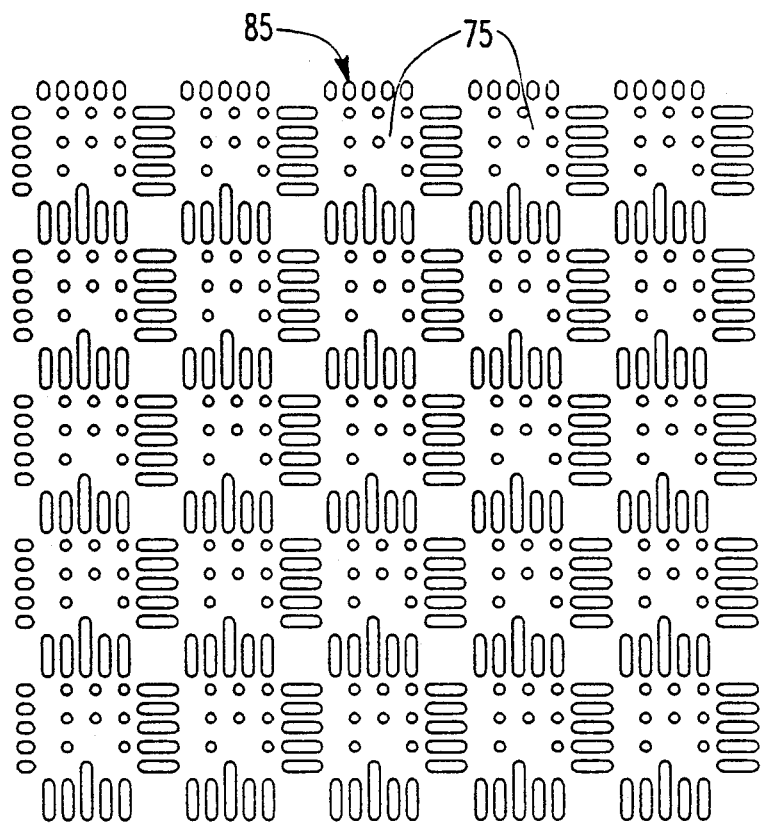
FIG. 9 is a plan view of a sheet of "smart" layers, and illustrates how the "smart" layers may be manufactured in sheets not unlike postage stamps, wherein individual "smart" layers are defined by circular perforations in the sheet which may be used to tear out individual "smart" layers.

FIG. 9 illustrates how "smart" layers 75 may be manufactured in sheets not unlike postage stamps, where individual "smart" layers 75 are defined by plated through-bores 85 which, when torn to create individual smart layers 75, form the previously described semi-cylindrical bores 81.

Figure 8B:
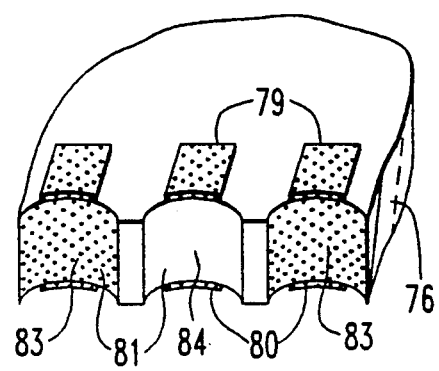
FIG. 8B is an enlarged, partial perspective view of the peripheral contact pads used in the "smart" layer to interconnect the pads of the electrical component to the pads of the PWB, illustrating how the metallic plating associated with these pads may be abrasively removed to disconnect a selected connector pad of the electrical component from the corresponding connector pad in a PWB.

In the method of implementing this second system of the invention, a selected component pad 34 is disconnected from its counterpart pad 7 in the PWB board 3 by a scraping away of the abradable, conductive plating 83 in the semi-cylindrical bore 81 associated with the selected pad 34. Such a scraping away exposes a bare semi-cylindrical bore 84 (as shown in FIG. 8B), and serves to break the contact between the upper and lower peripheral contact pads 79,80 associated with the selected component pad 34. A conductive strip 69 is next fabricated between one of the circular connector pads 77 associated with an unused via 52, and the peripheral contact pad 79 that is disconnected from its lower pad 80 but that will maintain its electrical connection with the selected pad 34 of the component when the module 1 is reassembled. A button connector 44 is inserted in the bore 45 of the interface 48 in order to interconnect the circular connector pad 77 that the conductive strip 69 terminates in, and one of unused vias 52. The module is then reassembled in one of the two arrangements illustrated in FIG. 10, which demonstrates how the "smart" layer 75 may be placed either between the component 30 and the interface 48 or between the interface 48 and the modified footprint 51 n the PWB 3. A was the case with the conductive strip 69 fabricated on the modified interface 72 illustrated in FIG. 7, the conductive strip 69 on the smart layer 75 may be formed by conventional photo-resist techniques, the only difference being that a conductive strip 69 on the smart layer 75 is formed from copper plating only, rather than copper plating that has been overplated with nickel and gold.

I claim:

1. A system for implementing a wiring change with respect to an electrical component detachably connected with the solderless printed wiring board module of the type having a connecting interface formed from a section of compliant, insulative sheet material that holds an array of resilient electrical connector means that electrically connects an array of contact pads disposed on a printed wiring board with a registrable array of contact pads disposed on said electrical component, comprising:

at least one unused via on said printed wiring board;
   means for electrically disconnecting a selected contact pad of said component from a contact pad disposed on said printed wiring board, and
   means including a conductive material mounted on a substrate formed form an insulative sheet material for electrically connecting said selected component contact pad to said unused via.

2. A system for implementing a wiring change as defined in claim 1, wherein said means for electrically disconnecting said selected contact pad includes a layer of hardenable, insulative material disposed over said printed wiring board pad.

3. A system for implementing a wiring change as defined in claim 1, wherein said substrate is the compliant, insulative sheet material that forms said connecting interface.

4. A system for implementing a wiring change as defined in claim 2, wherein said hardenable, insulative material is an ultra-violet curable epoxy.

5. A system for implementing a wiring change as defined in claim 2, wherein said insulative sheet material of said connecting interface includes a pattern of spaced apart conductive lands, and wherein said strip of conductive material that interconnects said selected component contact pad to said unused via is formed by interconnecting some of said lands.

6. A system for implementing a wiring change as defined in claim 5, wherein said lands are interconnected by the application of a hardenable conductive material.

7. A system for implementing a wiring change as defined in claim 1, wherein said substrate is formed form a thin layer of compliant, insulative sheet material that is separate from said connecting interface and which includes a plurality of through-holes extending through its thickness that have been plated with conductive material for maintaining the electrical connection between the printed wiring board contact pads and the component contact pads when said thin layer is disposed over one side of said interface.

8. A system for implementing a wiring change as defined in claim 7, wherein said selected component contact pad is electrically disconnected from said resilient electrical connector means by abrasively removing at least part of the plating from around the through-hole in the thin layer that conducts electrical current therebetween.

9. A system for implementing a wiring change as defined in claim 7, wherein said strip of conductive material that electrically connects said selected component contact pad to said unused via is formed by providing a thin strip of conductive metal on said thin layer between the conductively plated through-holes associated with said selected component contact pad and said unused via.

10. A system for implementing a wiring change with respect to an electrical component detachably connected within a solderless printed wiring board module of the type having a connecting interface formed from a section of compliant, insulative sheet material that holds an array of resilient electrical connector means that electrically connects an array of contact pads disposed on a printed molding board with a registrable array of contact pads disposed on said electrical component, comprising:

at least one unused via on said PWB located between said array of printed wiring board contact pads;
insulating means for electrically disconnecting a selected contact pad of said component from a contact pad disposed on said printed wiring board, and
a strip of conductive material on an insulative substrate for electrically connecting said selected component contact pad to said unused via.

11. A system as defined in claim 10, wherein said substrate is the compliant, insulative sheet material that forms said connecting interface.

12. A system as defined in claim 11, wherein said insulative sheet material of said connecting interface includes a pattern of spaced apart conductive lands, and wherein said strip of conductive material that interconnects said selected component contact pad to said unused via is formed by interconnecting some of said lands.

13. A system as defined in claim 12 wherein said strip of conductive material is formed by the application of a hardenable conductive material onto said insulative sheet material.

14. A system as defined in claim 11, wherein said compliant, insulative sheet material includes a pattern of through-holes for receiving said resilient electrical connector means, and said holes are plated with a conductive material, and said strip of conductive material is formed by creating a flat strip of conductive metal between the conductively plated through-holes associated with the electrical connector means in contact with said unused via and said selected component contact pad.

15. A system as defined in claim 10 wherein said substrate is formed from a thin layer of compliant, insulative sheet material that is separate from said connecting interface and which includes a plurality of through-holes extending through its thickness that have been plated with conductive material for maintaining the electrical connection between the printed wiring board contact pads and the component contact pads when said thin layer is disposed over one side of said interface.

16. A system as defined in claim 15, wherein said selected component contact pad is electrically disconnected from said resilient electrical connector means by abrasively removing at least part of the plating from around the through-hole in the thin layer that conducts electrical current therebetween.

17. A system as defined in claim 15, wherein said strip of conductive material that electrically connects said selected component contact pad to said unused via is formed by providing a thin strip of conductive metal on said thin layer between the conductively plated through-holes associated with said selected component contact pad and said unused via.

18. A system for implementing a wiring change with respect to an electrical component detachably connected within a solderless printed wiring board module of the type having a connecting interface formed from a section of compliant, insulative sheet material that holds an array of resilient electrical connector means that electrically connects an array of contact pads disposed on a printed wiring board with a registrable array of contact pads disposed on said electrical component, comprising:

at least one unused via on said printed wiring board located between said array of printed wiring board contact pads;
insulating means including a layer of insulative material disposed between a printed wiring board contact pad and a resilient electrical connector associated with said printed wiring board contact pad to electrically disconnect a selected component contact pad associated with said printed wiring board contact pad, and
a strip of conductive material disposed on the insulative sheet material of the interface for electrically connecting said selected component contact pad to said unused via.

19. A system for implementing a wiring change with respect to an electrical component detachably connected within a solderless printed wiring board module of the type having a connecting interface formed from a section of compliant, insulative sheet material that holds an array of resilient electrical connector means that electrically connects an array of contact pads disposed on a printed wiring board with a registrable array of contact pads disposed on said electrical component, comprising:

a thin layer of compliant, insulative sheet material having an array of conductive regions disposed through its thickness for maintaining the electrical connections between the printed wiring board contact pads and the component contact pads when said thin layer is disposed over one side of said connecting interface, wherein said conductive regions are removable for insulating one or more selected component contacts pads with said PWB contact pads.

20. A method for implementing a wiring change with respect to an electrical component detachably connected within a solderless printed wiring board module of the type having a connecting interface formed from a section of compliant, insulative sheet material that holds an array of resilient electrical connector means that electrically connects an array of contact pads disposed on a printed wiring board with a registrable array of contact pads disposed on said electrical component when said interface is disposed between said component and said printed wiring board and said component and printed wiring board are compressed together, comprising the steps of:

providing at least one unused via on said printed wiring board,
electrically disconnecting a selected contact pad of said component from the contact pad of said printed wiring board by interposing an insulative material between said resilient electrical connector means and said printed wiring board contact paid and
electrically connecting said selected component contact pad to said unused via by providing a strip of conductive material mounted on a substrate between the electrical component and the contact pads of the printed wiring board.

21. A method as defined in claim 20, wherein said substrate is the compliant, insulative sheet material that forms said connecting interface.

22. A method as defined in claim 20, wherein said selected component contact pad is electrically disconnected from said resilient electrical connector means by the application of a hardenable insulating material over said printed wiring board pad.

23. A method as defined in claim 22 wherein said hardenable insulating material is an ultra-violet epoxy.

24. A method as defined in claim 21, wherein said insulative sheet material of said connecting interface includes a pattern of spaced apart conductive lands, and wherein said strip of conductive material that interconnects said selected component contact pad to said unused via is formed by interconnecting some of said lands.

25. A method as defined in claim 21, wherein said strip of conductive material is formed by the application of a hardenable conductive material onto said insulative sheet material.

26. A method as defined in claim 24, wherein said lands are interconnected by the application of a hardenable conductive material.

27. A method as defined in claim 26, wherein said hardenable conductive material is an ultra-violet-curable conductive epoxy material.

28. A method as defined in claim 21, wherein said compliant, insulative sheet material includes a pattern of through-holes for receiving said resilient electrical connector means, and said holes are plated with a conductive material, and said strip of conductive material is formed by creating a flat strip of conductive metal between the conductively plated through-holes associated with the electrical connector means in contact with said unused via and said selected component contact pad.

29. A method as defined in claim 28, wherein said compliant, insulative sheet material is initially clad in copper, and said strip of conductive metal is a copper, nickel and gold strip created by the application of a photoresist that defines said copper strip, the etching away of unwanted copper, nickel and gold around said strip and the stripping away of said photoresist.

30. A method as defined in claim 20, wherein said substrate is formed from a thin layer of compliant, insulative sheet material that is separate from said connecting interface and which includes a plurality of through-holes extending through its thickness that have been plated with conductive material for maintaining the electrical connection between the printed wiring board contact pads and the component contact pads when said thin layer is disposed over one side of said interface.

31. A method as defined in claim 30, wherein said selected component contact pad is electrically disconnected from said resilient electrical connector means by abrasively removing at least part of the plating from around the through-hole in the thin layer that conducts electrical current therebetween.

32. A method as defined in claim 30, wherein said strip of conductive material that electrically connects said selected component contact pad to said unused via is formed by providing a thin strip of conductive metal on said thin layer between the conductively plated through-holes associated with said selected component contact pad and said unused via.

33. A method as defined in claim 32, wherein said thin layer is initially clad in copper, and said thin strip is created by the application of a photoresist that defines said strip, the etching away of unwanted copper around said strip and the stripping away of said photoresist.

34. A method for implementing a wiring change with respect to an electrical component detachably connected within a solderless printed wiring board module of the type having a connecting interface formed from a section of compliant, insulative sheet material that holds an array of resilient electrical connector means that electrically connects an array of contact pads disposed on a printed wiring board with a registrable array of contact pads disposed on said electrical component when said interface is disposed between said component and said printed wiring board and said component and printed wiring board are compressed together, comprising the steps of:
providing at least one unused via on said printed wiring board,
removing said component, and said connecting interface from the printed wiring board,
electrically disconnecting a selected electrical pad of said component from the contact pad of said printed wiring board by applying a layer of hardenable, insulative material over the printed wiring board pad associated with said selected component pad; and
electrically connecting said selected component pad to said via by providing a strip of conductive material on the interface between the resilient electrical connector means associated with said selected component contact pad and said unused via, and
re-mounting said component and said connecting interface back onto the printed wiring board.

35. A method for implementing a wiring change with respect to an electrical component detachably connected within a solderless printed wiring board module of the type having a connecting interface formed from a section of compliant, insulative sheet material that holds an array of resilient electrical connector means that electrically connects an array of contact pads disposed on a printed wiring board with a registrable array of contact pads disposed on said electrical component when said interface is disposed between said component and said printed wiring board and said component and printed wiring board are compressed together comprising the steps of:
providing at least one unused via on said PWB;
removing said component and said connecting interface from the printed wiring board,
providing a thin layer of compliant, insulative sheet material having a plurality of through-holes extending through its thickness that have been plated with a conductive material for maintaining the electrical connections between the printed wiring board and the component contact pads when said thin layer is disposed over one side of said connecting interface and said component and connecting interface are re-mounted onto the printed wiring board;
electrically disconnecting a selected electrical pad of said component from the contact pad of said printed wiring board by abrasively removing at least part of the conductive plating from around the through-hole in said layer that conducts current therebetween, and
electrically connecting said selected component pad to said via by providing a flat strip of conductive material on the thin layer between the plated through-holes associated with said selected component contact pad and said unused via.

* * * * *